(12) United States Patent
Jiang et al.

(10) Patent No.: US 9,532,056 B2
(45) Date of Patent: Dec. 27, 2016

(54) METHOD FOR ADAPTIVE ENTROPY CODING OF TREE STRUCTURES

(75) Inventors: Wenfei Jiang, Beijing (CN); Kangying Cai, Beijing (CN); Zhibo Chen, Beijing (CN)

(73) Assignee: Thomson Licensing, Issy les Moulineaux (FR)

( * ) Notice: Subject to any disclaimer, the term of this patent is extended or adjusted under 35 U.S.C. 154(b) by 198 days.

(21) Appl. No.: 14/233,519

(22) PCT Filed: Jul. 18, 2011

(86) PCT No.: PCT/CN2011/077279
§ 371 (c)(1),
(2), (4) Date: Jan. 17, 2014

(87) PCT Pub. No.: WO2013/010317
PCT Pub. Date: Jan. 24, 2013

(65) Prior Publication Data
US 2014/0185668 A1    Jul. 3, 2014

(51) Int. Cl.
*H04N 7/12* (2006.01)
*H03M 5/00* (2006.01)
(Continued)

(52) U.S. Cl.
CPC ........... *H04N 19/00969* (2013.01); *G06T 9/00* (2013.01); *G06T 9/001* (2013.01);
(Continued)

(58) Field of Classification Search
CPC ................... H04N 19/00969; H04N 19/00533; H04N 19/96; H04N 19/44; G06T 9/40
See application file for complete search history.

(56) References Cited

U.S. PATENT DOCUMENTS

| 6,453,280 B1 | 9/2002 | Yang et al. |
| 6,563,500 B1 | 5/2003 | Kim et al. |
| (Continued) | | |

FOREIGN PATENT DOCUMENTS

| CN | 1250189 | 4/2000 |
| CN | 1378395 | 11/2002 |
| (Continued) | | |

OTHER PUBLICATIONS

Devillers et al., "Geometric compression for interactive transmission", IEEE Visualization Proceedings, 13-13 Oct. 2000, Salt Lake City, UT, USA, pp. 319-326.
(Continued)

*Primary Examiner* — Dave Czekaj
*Assistant Examiner* — Tsion B Owens
(74) *Attorney, Agent, or Firm* — Brian J. Dorini; Xiaoan Lu (57) ABSTRACT

In 3D mesh coding, the geometry data is compressed by spatial tree based approaches. Bitstreams that result from the traversal of a tree structure of spatial tree based approaches for encoding 3D mesh models have systematically special redundancies, which is exploited for further improving the mesh model compression. A method for encoding a bitstream comprises steps of defining at least a first and a second symbol group of binary symbols, with S1 being a subset of S2, determining within the bitstream first portions, second portions and third portions, wherein first portions have Th1 or more consecutive S1 symbols and second portions have Th2 or more consecutive S2 symbols, encoding the bitstream, wherein first portions, second portions and third portions are encoded using different codes, and encoding values indicating the boundary positions between the first, second and third portions in the bitstream.

16 Claims, 4 Drawing Sheets

(51) Int. Cl.
  *H04N 19/96* (2014.01)
  *G06T 9/40* (2006.01)
  *G06T 9/00* (2006.01)
  *H04N 19/44* (2014.01)
  *H03M 7/30* (2006.01)
  *H03M 7/40* (2006.01)

(52) U.S. Cl.
  CPC ............ *G06T 9/005* (2013.01); *G06T 9/40* (2013.01); *H03M 7/40* (2013.01); *H03M 7/4056* (2013.01); *H03M 7/6088* (2013.01); *H03M 7/6094* (2013.01); *H04N 19/44* (2014.11); *H04N 19/96* (2014.11)

(56) References Cited

U.S. PATENT DOCUMENTS

| | | | |
|---|---|---|---|
| 7,548,175 | B2 | 6/2009 | Yokose et al. |
| 8,009,069 | B2 | 8/2011 | Chen et al. |
| 8,767,823 | B2 * | 7/2014 | Jou ............... H04N 19/00121 375/240.03 |
| 9,035,807 | B2 * | 5/2015 | Jiang ............... G06T 17/005 341/107 |
| 2002/0080902 | A1 | 6/2002 | Kim et al. |
| 2004/0170335 | A1 | 9/2004 | Pearlman et al. |
| 2007/0282933 | A1 | 12/2007 | Monro |
| 2008/0030384 | A1 | 2/2008 | Yokose et al. |
| 2009/0202160 | A1 * | 8/2009 | Kim ............... G06T 17/20 382/233 |
| 2010/0194610 | A1 | 8/2010 | Chen et al. |
| 2010/0207941 | A1 * | 8/2010 | Lee ............... G06T 9/40 345/424 |
| 2016/0086353 | A1 * | 3/2016 | Lukac ............... G06T 9/00 345/419 |

FOREIGN PATENT DOCUMENTS

| | | |
|---|---|---|
| CN | 1394418 | 1/2003 |
| CN | 1925613 | 3/2007 |
| CN | 1946180 | 4/2007 |
| CN | 1964467 | 5/2007 |
| CN | 1993758 | 7/2007 |
| CN | 101496290 | 7/2009 |
| CN | 101795407 | 8/2010 |
| EP | 1246385 | 10/2002 |
| EP | 1400954 | 3/2004 |
| EP | 1783975 | 5/2007 |
| JP | 2008067361 | 3/2003 |
| JP | 2006136020 | 5/2006 |
| JP | 2010178339 | 8/2010 |
| WO | WO2005119678 | 12/2005 |
| WO | WO2010063883 | 6/2010 |

OTHER PUBLICATIONS

Peng et al., "Geometry-guided progressive lossless 3D mesh coding with octree (OT) decomposition", ACM Trans. on Graphics, vol. 24, No. 3, Jul. 2005.

Search Report Dated April 26, 2012.

* cited by examiner

| # | → | Bitstream | | | | | | →  |
|---|---|---|---|---|---|---|---|---|
| 1 | N1 | L1 | | | N2 | L2 | N3 | L3 |
| 2 | N1 | K1 | J1 | K2 | N2 | N3 | J2 | N3 | J3 |
| 3 | N1 | K1 | J1 | | N2 | | J2 | N3 | J3 |
| 4 | H1 | | H2 | | | | | |

METHOD FOR ADAPTIVE ENTROPY CODING OF TREE STRUCTURES

This application claims the benefit, under 35 U.S.C. §365 of International Application PCT/CN2011/077279, filed Jul. 18, 2011, which was published in accordance with PCT Article 21(2) on Jan. 24, 2013 in English.

FIELD OF THE INVENTION

This invention relates to a method for adaptive entropy coding of tree structures, and to a corresponding apparatus. Further, the invention relates to a method for adaptive entropy decoding of tree structures, and a corresponding apparatus.

BACKGROUND

Entropy coding has been studied for decades. Basically, there are three kinds of entropy coding methods: variable length coding (VLC), like Huffman coding, arithmetic coding, and dictionary-based compression, like Lempel-Ziv compression or Lempel-Ziv-Welch compression. The VLC codes use integer number of bits to represent each symbol. Huffman coding is the most widely used VLC method. It assigns fewer bits to the symbol with greater probability, while assigning more bits to the symbol with smaller probability. However, Huffman code cannot be optimal unless the probability of each symbol is an integer power of ½. On the contrary, arithmetic coding can allocate fractional bits to each symbol so that it can approach better the entropy of a group of data. Huffman code and arithmetic code have been widely used in the existing image/video compression standards, e.g., JPEG, MPEG-2, H.264/AVC. The Lempel-Ziv (LZ) or Lempel-Ziv-Welch (LZW) utilize a table-based compression model where table entries are substituted for repeated strings of data. For most LZ methods, this table is generated dynamically from earlier input data. The algorithm is designed to be fast to implement but is not usually optimal because it performs only limited analysis of the data. This category of algorithms has been employed in GIF, Zip, PNG and some other standards.

In 3D mesh coding, the geometry data is usually compressed by spatial tree based approaches, e.g. kd-tree based [OG00] or octree based [PK05]. These algorithms organize the input spatial points by some spatial tree. Then they traverse the tree structure and record the necessary information for later restoring the input points. While building the spatial tree, a cell is recursively subdivided until each nonempty cell is small enough to contain only one vertex and enable a sufficiently precise reconstruction of the vertex position. Initially, a bounding box is constructed around all points of a 3D model. The entire bounding box of all 3D points is regarded as a single cell in the beginning. As the vertex positions can be restored from the bounding box of the corresponding cells, the spatial tree based algorithms include that they can achieve multi-resolution compression and the same compression ratio as single-resolution compression algorithms.

Figure 1:
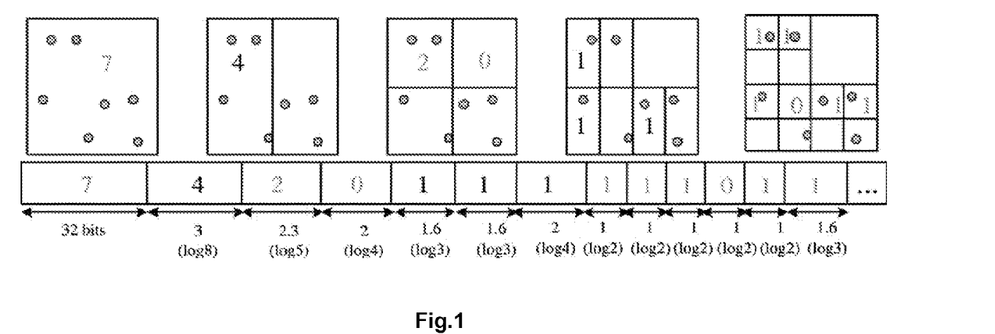

With each iteration, [OG00] subdivides a cell into two child cells and encodes the number of vertices in one of the two child cells, as shown in FIG. 1. If a parent cell contains p vertices, the number of vertices in one of the child cells can be encoded using $\log_2 (p+1)$ bits with an arithmetic coder.

Figure 2:
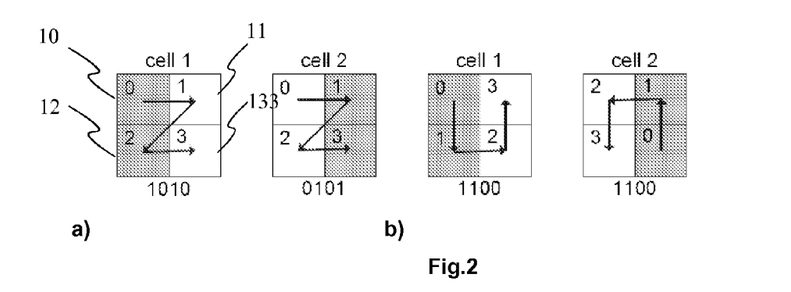
FIG. 2 the principle of quadtree geometry coding in a 2D case.

On the other hand, [PK05] subdivides in each iteration a non-empty cell into eight child cells. For each octree cell subdivision, the geometry coder encodes the number T ($1 \leq T \leq 8$), of non-empty child cells and the configuration of non-empty child cells among $K_T = C_8^T$ possible combinations. When the data is encoded straight forwardly, T takes 3 bits and the non-empty child cell configuration takes $\log_2 K_T$ bits. To improve coding efficiency, [PK05] estimates for each child cell the pseudo-probability of being not empty. The traversal order of child cells is adapted according to a probability descending order. For the ease of illustration, a 2D example resulting in quadtree child cells, and resulting code words, are shown in FIG. 2. The traversal orders are denoted by arrows.

However, it is always desirable to improve compression in order to achieve a higher compression ratio. It is particularly desirable to achieve this without data loss, i.e. a method that allows a full-quality decompression, resulting in a (quasi-) lossless reproduction.

SUMMARY OF THE INVENTION

The present invention is based on the recognition of the fact that bitstreams have systematically special redundancies if they result from the traversal of a tree structure of spatial tree based approaches for encoding 3D mesh models, and that this can be exploited for further improving the mesh model compression. In particular, higher compression efficiency can be achieved for tree-based approaches where each cell subdivision results in more than two child cells, such as for example quadtree-based or octree-based methods.

Therefore, the present invention provides at least a method for encoding a bitstream, a method for decoding an encoded bitstream, an apparatus for encoding a bitstream and an apparatus for decoding an encoded bitstream.

Basically, a method for encoding a bitstream comprises steps of defining at least a first and a second symbol group of binary symbols, with S1 being a subset of S2, determining within the bitstream first portions, second portions and third portions, wherein first portions have Th1 or more consecutive S1 symbols and second portions have Th2 or more consecutive S2 symbols, encoding the bitstream, wherein first portions, second portions and third portions are encoded using different codes, and encoding values indicating the boundary positions between the first, second and third portions in the bitstream.

In one embodiment, a method for encoding a bitstream comprises steps of defining at least a first and a second symbol group of binary symbols, wherein the first symbol group is a subset of the second symbol group, determining within the bitstream two or more first portions, zero or more second portions and two or more third portions, wherein each first portion has at least Th1 consecutive symbols of the first symbol group, each second portion has at least Th2 consecutive symbols of the second symbol group (but not at least Th1 consecutive symbols of the first symbol group), and wherein remaining parts of the bitstream are third portions,
determining in the bitstream a part that comprises only first and third portions, encoding the bitstream, wherein said first portions are encoded using a first code, said second portions (if existing) are encoded using a second code and said third portions are encoded using a third code, and wherein also values indicating the boundary positions between the first, second and third portions in the bitstream are encoded, and wherein in said part that comprises only first and third portions the encoding of boundary positions between a first portion and an adjacent third portion is skipped if the third portion has a pre-defined length, and is implicitly encoded if the third portion has a different length other than the pre-defined length.

That is, each third portion of the bitstream has not at least Th1 consecutive symbols of the first symbol group and not at least Th2 consecutive symbols of the second symbol group. Typically, the third portions of the bitstream are rather short and comprise only few symbols, often only one symbol.

Different kinds of implicitly encoding boundary positions between a first portion and an adjacent third portion in the second part are possible, e.g. by swapping two adjacent boundary positions (which may be determined since boundary positions have a monotonic increasing or decreasing order), or by an escape sequence that may be separate or attached to another boundary position value, or by a distinctly stored symbol.

In one embodiment, the skipped boundary positions (i.e. whose encoding is skipped) are the left (or initial, or opening) boundaries of the third portions within said part of the bitstream. In another embodiment, the skipped boundary positions are the right (final, closing) boundaries of the third portions within said part of the bitstream.

In one aspect, a method for encoding a bitstream comprises steps of defining at least a first and a second symbol group of binary symbols, wherein the first symbol group comprises less symbols than the second symbol group and symbols of the first symbol group are also included in the second symbol group, determining within the bitstream two or more first portions, each having at least a first defined minimum number of consecutive symbols of the first symbol group, zero or more second portions, each having at least a second defined minimum number of consecutive symbols of the second symbol group, and two or more third portions comprising remaining portions of the bitstream, dividing the bitstream into at least a consecutive first part and a consecutive second part, wherein the first part comprises at least one of said third portions and said zero or more second portions, and the second part comprises at least one of said first portions and said at least two second portions, encoding the bitstream, wherein said one or more first portions are encoded using a first code in a first encoder, said one or more second portions are encoded using a second code in a second encoder and said one or more third portions are encoded using a third code in a third encoder, and encoding the lengths (or boundary positions, respectively) of the first, second and third portions in the bitstream, wherein at least in the second part said encoding of the length (or at least one of the boundary positions) of the first portions is skipped if the length is a pre-defined length (i.e. the boundary position has a pre-defined distance to a pre-defined adjacent boundary position).

In other words, the second part of the bitstream is constructed such that it does not comprise any of said third portions. In one embodiment, it is the final part of the bitstream. In one embodiment, in determining the various portions, adjacent portions of equal type are accumulated, so that adjacent portions in the stream always have different types.

In one aspect, an apparatus for encoding a bitstream comprises one or more processing means, including
a processing means for defining at least a first and a second symbol group of binary symbols, wherein the first symbol group is a subset of the second symbol group,
a processing means for determining within the bitstream two or more first portions, zero or more second portions and two or more third portions, wherein each first portion has at least Th1 consecutive symbols of the first symbol group, each second portion has at least Th2 consecutive symbols of the second symbol group (but not at least Th1 consecutive symbols of the first symbol group), and wherein remaining parts of the bitstream are third portions,
a processing means for determining in the bitstream a part that comprises only first and third portions,
encoding means for encoding the bitstream, wherein said first portions are encoded in a first encoder using a first code, said second portions (if existing) are encoded in a second encoder using a second code and said third portions are encoded in a third encoder using a third code, and
boundary/length encoding means for encoding values indicating the boundary positions between the first, second and third portions in the bitstream (or the lengths of the first, second and third portions), wherein in said part that comprises only first and third portions the encoding of boundary positions between a first portion and an adjacent third portion is skipped if the third portion has a pre-defined length (i.e. the boundary position has a pre-defined distance to a pre-defined adjacent boundary position).

A computer readable medium having executable instructions to cause a computer to perform a method as specified above.

Advantageous embodiments of the invention are disclosed in the dependent claims, the following description and the figures.

BRIEF DESCRIPTION OF THE DRAWINGS

Exemplary embodiments of the invention are described with reference to the accompanying drawings, which show in FIG. 1 the principle of kd-tree geometry coding in a 2D case.

DETAILED DESCRIPTION OF THE INVENTION

The following embodiments are based on octree representation of 3D mesh models. The invention may be adapted to other data sets or applications, as defined further below. The basic method of octree representation for a 3D mesh coding scheme is known from [OG00], and explained herein with respect to FIG. 2. Although FIG. 2 shows the principle of quadtree geometry coding in a 2D case, it can be easily adapted to a 3D model, as shown below with respect to FIG. 8. For encoding, a current parent cell is split into four child cells that are traversed in a predefined order, and a single bit per child cell indicates whether or not there is a point within the child cell. E.g. in FIG. 2a), the child cells of two parent cells 1,2 are traversed as shown, (with a non-empty child cell being colored grey). Child cells 10,11,12,13 of the first parent cell 1 are encoded by a first sequence 1010, since the first and third child cells 10,12 of the traversal are non-empty (i.e. contain one or more points), which is indicated by a one. The second and fourth child cells 11,13 are empty (i.e. contain no points), which is encoded by a zero. FIG. 2b) shows the same cells using a different traversal, and resulting code.

Figure 8:
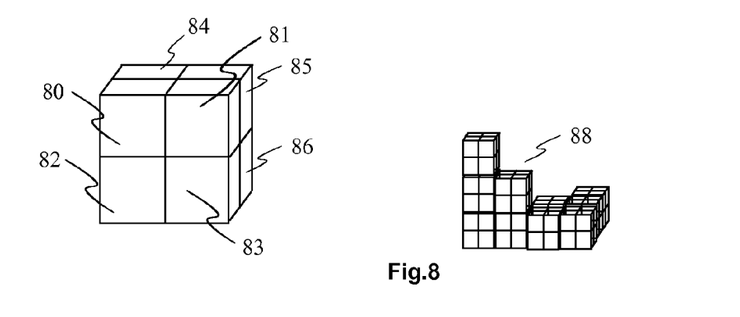
FIG. 8 the principle of octree-based 3D geometry coding, compared to quadtree-based 2D geometry coding.

FIG. 8 shows parent and child cells of an octree scheme. In the octree scheme, a parent cell is split into eight child cells 80, . . . ,86 (one hidden child cell behind lower left cell 82 is not shown). A possible traversal order could be left-right, up-down and front-back, resulting in a traversal sequence of cells 80-81-82-83-84-85-(hidden cell behind lower left cell 82)-86. Correspondingly, in the octree case the non-empty child cell configuration is denoted by 8-bit binaries, covering all the 255 possible combinations of empty and non-empty child cells. Separate encoding of the number of non-empty-child cells is not required. Tab. 1 is an example of a non-empty-child-cell configuration sequence.

TABLE 1

Child cell configuration sequence 11111111
01100110
00111011
11001100
. . .
00010000
00000010
00000010
10000000
00000001

Although described in detail above, the traversal order of child cells within a parent cell is not very relevant for the present invention. In principle, any traversal order can be used substantially equivalently for the present invention.

The 8-bit symbols can be efficiently compressed by conventional arithmetic coding, but the result is not as good (i.e. efficient) as it could be. The present invention provides an encoding method with improved efficiency, and a corresponding decoding method.

255} is defined whose elements are any possible symbols. Further, another symbol set S1={1, 2, 4, 8, 16, 32, 64, 128} is defined whose elements are integer powers of 2, i.e. the frequently occurring symbols. It has been observed that there are often long runs of the symbols contained in S1. Thus, the probability model is simplified into an 8-symbol model in the subsequences that contain only S1 symbols.

Figure 3:
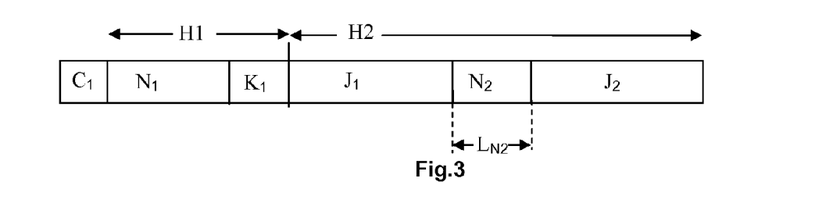
FIG. 3 the basic structure of a bitstream.

FIG. 3 shows the basic structure of a bitstream. The bitstream has two first portions J1, J2 (i.e. portions of a first type J), one second portion K1 (i.e. portion of a second type K) and three third portions N1, N2, N3 (i.e. portions of a third type N).

Each first portion has at least a first pre-defined number Th1 of consecutive symbols of the first symbol group S1, each second portion has at least a second pre-defined number Th2 of consecutive symbols of the second symbol group, and remaining parts of the bitstream are third portions N1, N2, N3. That is, the third portions N1, N2, N3 can have any symbols that may appear in the bitstream, but not enough (i.e. less than the first pre-defined number Th1) consecutive symbols of the first symbol group S1 to qualify as a first portion, and not enough (i.e. less than the second pre-defined number Th2) consecutive symbols of the second symbol group to qualify as a second portion. Of course, although the first symbol group S1 is a subset of the second symbol group S2, a subsequence of consecutive symbols that qualifies as a first portion J is encoded as a first portion J, and not as a second portion K. The reason is that first portions can be encoded with higher efficiency than second portions. Further, first and second portions J,K can be encoded with higher efficiency than the third portions N, so that subsequences that qualify as second portion K will be encoded as second portions.

Suitable numeric values for Th1 (e.g. for 3D mesh models) are in the range of 10-100, but may be higher depending on the nature of the input sequence, or depth and structure of the traversed tree respectively. Suitable numeric values for Th2 (e.g. for 3D mesh models) are in the range of 20-200, but may be higher depending on the nature of the input sequence, or depth and structure of the traversed tree respectively. Exemplary values are Th1=50 and Th2=70. These values are optimized for the compression of 3D mesh models, and in particular for the compression of instance positions obtained by repetitive structure detection in 3D mesh models. They can be adjusted when applied to other

TABLE 2

Distribution probability p of some of the octree symbols in a 3D model

| Symbol | p | Symbol | p | Symbol | p | Symbol | p | Symbol | p |
|---|---|---|---|---|---|---|---|---|---|
| 00000100 | 0.1280 | 00000101 | 0.0034 | 10100000 | 0.0020 | 00001010 | $10^{-3}$ | 01000100 | $10^{-3}$ |
| 00000010 | 0.1275 | 00001001 | 0.0030 | 00000011 | 0.0015 | 00001011 | $10^{-3}$ | 01100010 | $10^{-3}$ |
| 00001000 | 0.1167 | 01100000 | 0.0025 | 00010001 | 0.0015 | 00001111 | $10^{-3}$ | 01101000 | $10^{-3}$ |
| 10000000 | 0.1162 | 10000010 | 0.0025 | 00010010 | 0.0015 | 00011000 | $10^{-3}$ | 10111011 | $10^{-3}$ |
| 01000000 | 0.1128 | 10001000 | 0.0025 | 00101000 | 0.0015 | 00011100 | $10^{-3}$ | 11001100 | $10^{-3}$ |
| 00010000 | 0.1118 | 00000110 | 0.0020 | 00110000 | 0.0015 | 00100110 | $10^{-3}$ | 11010000 | $10^{-3}$ |
| 00000001 | 0.1108 | 00001100 | 0.0020 | 01010000 | 0.0015 | 00111011 | $10^{-3}$ | 11111111 | $10^{-3}$ |
| 00100000 | 0.1098 | 00010010 | 0.0020 | 11000000 | 0.0015 | 01000010 | $10^{-3}$ | 00000111 | $5 \cdot 10^{-4}$ |

The distribution probability of the most frequently occurring symbols in a typical complex 3D model (m1007) is shown in Tab. 2. As can be seen, the symbols which has only one "1" in the binary representation occurs with an overwhelming probability. The geometrical explanation is that, the vertices seldom share a cell after several subdivisions. According to the invention, a symbol set S0={1, 2, 3, . . . , applications. Thus, while in one embodiment the leaf nodes of the tree are points of a 3D mesh model, but in another embodiment the leaf nodes of the tree are instance positions of repetitive structures in multi-connected 3D mesh models.

When a subsequence is divided, it costs few bytes to indicate the boundary. The cost is compensated by the compression improvement by replacing the S0 model with the S1 or S2 model. Since the S2 model has much more symbols than S1, the gain obtained by replacing S0 model with S2 is less. Thus, Th2 should be larger than Th1 to be more effective. However, the invention works also with Th2=Th1 or Th2<Th1.

As also shown in FIG. 3, decoder control information is encoded at the beginning of the bitstream. The decoder control information comprises the values $C_1$ that indicate the boundary positions between the first, second and third portions of the bitstream.

In the following, an example is given. Consider the following symbol sequence: 02123012300113230001110110110010111100001.

There are sixteen "0"s, sixteen "1"s, four "2"s, four "3"s. So the entropy of the symbol sequence is: $-16*\log_2(16/40)-16*\log_2(16/40)-4*\log_2(4/40)-4*\log_2(4/40) \approx 68.88$. That is the best direct arithmetic coding can do.

However, further compression can be achieved if we split the symbol sequence into two subsequences. The first subsequence 0212301230011323 comprises all possible types of symbols and ends by the sixteenth symbol. Its four symbol types are evenly distributed, have the entropy of $-4*\log_2(4/16)-4*\log_2(4/16)-4*\log_2(4/16)-4*\log_2(4/16)=32$.

The second subsequence 0001110110110010111100001 contains only two types of symbols, namely sixteen "0" and sixteen "1", and has the entropy of $-16*\log_2(16/32)-16*\log_2(16/32)=32$.

The total entropy is 32+32=64. Therefore, further improvement can be made as long as the splitting point is appropriately given, as defined below. The cost of splitting point representation is a trivial overhead for the compression of mass symbols, and it is also optimized by the invention.

The adaptive entropy coding method according to the invention, e.g. for octree coding, works as follows. As mentioned above, the vast majority of the octree symbols have only one "1" in the binary representation. Two symbol sets are defined as S0={1, 2, 3 . . . 255} and S1={1, 2, 4, 8, 16, 32, 64, 128}, i.e. the S1 are symbols having only one "1" in the binary representation. If the S1 symbols were coded independently, this would reduce the entropy but bring about the overhead of the bits specifying the location of such symbols. The invention optimizes both the entropy reduction and the overhead, substantially by only detecting and encoding long runs of the S1 symbols.

To further improve the compression, another symbol set S2={3, 5, 9, 17, 33, 65, 129, 6, 10, 18, 34, 66, 130, 12, 20, 36, 68, 132, 24, 40, 72, 136, 48, 80, 144, 96, 160, 192, 1, 2, 4, 8, 16, 32, 64, 128} is defined, whose elements are the symbols that have up to two (i.e. one or two) "1"s in the binary representation. Coding a group of symbols contained in S2 also improves the compression in certain conditions. Thus, the invention employs two or three arithmetic codecs to encode and/or decode the symbols within different symbol sets independently. In one embodiment, the two or three arithmetic codecs operate simultaneously, or at least in a partial time overlap. Thus, the whole encoding and/or decoding process is accelerated.

In principle, the different portions and types of portions J,K,N of the bitstream can be determined in any manner. One exemplary method for determining the different portions of the bitstream is described in the following with respect to FIG. 7, which shows an exemplary method for splitting a bitstream into first, second and third portions.

Figure 7:
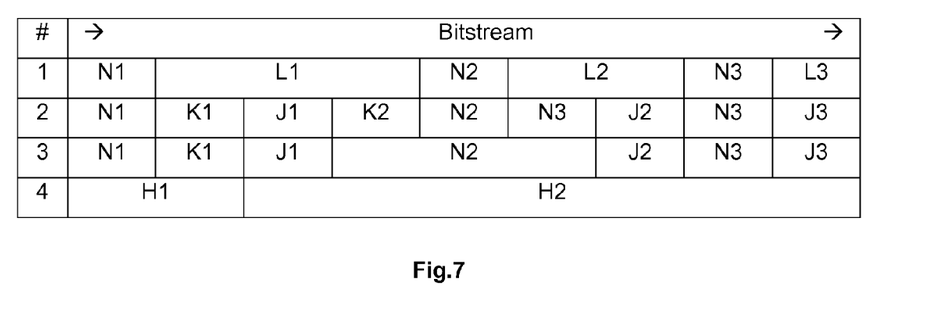
FIG. 7 an exemplary method for splitting a bitstream into first, second and third portions.

In FIG. 7, after receiving or reading from any electronic storage an input sequence of symbols, the symbols are scanned from the beginning, and all subsequences are found that contain more than Th1 consecutive S2 symbols, where Th1 is a predefined threshold as already defined above. Denote these subsequences by $L_1, L_2 \ldots L_n$ while the remaining by $N_1, N_2 \ldots N_n$. This results in a structure as shown in line #1 of FIG. 7.

Then, search each L type subsequence found in the previous step for subsequences that contain more than Th1 consecutive S1 symbols. Denote them by $J_1, J_2 \ldots J_m$. The subsequences obtained by removing $J_j$s from $L_i$ are denoted by $K_1, K_2 \ldots K_n$ (see line #2 of FIG. 7). The $K_j$s which contain fewer than Th2 symbols are put back into $N_i$, where Th2 is a predefined threshold for S2 symbols as described above (see line #3 of FIG. 7). In this way, the symbol sequence is divided into a number of subsequences (also called portions or clips herein) of three types J, K and N. Each first type of portions J has at least Th1 consecutive S1 symbols (first symbol group), each second type of portions K has at least Th2 consecutive S2 symbols (second symbol group), and remaining parts of the input bitstream are third portions N1, N2, N3 that have less than Th1 consecutive S1 symbols and less than Th2 consecutive S2 symbols. The bitstream can be logically divided into two consecutive parts, namely a first consecutive part H1 that comprises at least all portions of K type, and a second part H2 that comprises only portions of J and N type. For encoding spatial trees, commonly a traversal order is used that ends with traversing leaf nodes of the tree structure. E.g. for 3D mesh models, a leaf node corresponds to one single point of the model. Thus, the stream (and thus the second part H2) always ends with a J type subsequence.

Figure 4:
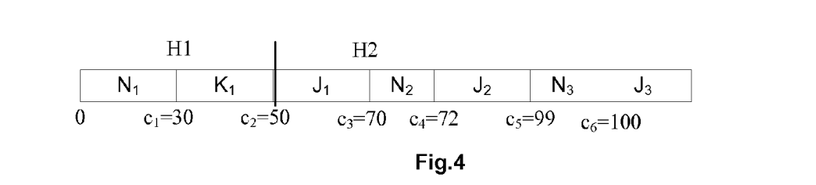
FIG. 4 an exemplary bitstream representing a 3D mesh model.

An exemplary resulting clip (without header) is shown in FIG. 4, where $c_1 \ldots c_6$ are the location indicators of the boundaries of the subsequences. Decoding works as follows. Concerning the boundaries, the encoding in one embodiment begins from the end of the bitstream, since the end is always known. In one embodiment, the location indicators are encoded/decoded in reverse order $c_6, \ldots, c_1$ in the header (see FIG. 10, not shown in FIG. 4), since the last one $c_6$ is used first for the decoding. The final portion is always of J type (i.e. only one bit set to 1), since a J type value correspond to a leaf node of the spatial tree. Thus, the final portion $J_3$ of the bitstream is a J type portion, beginning from symbol #100 and ending with the last symbol of the stream. The symbols are from the first symbol set S1, since it is a J type subsequence.

Figure 10:
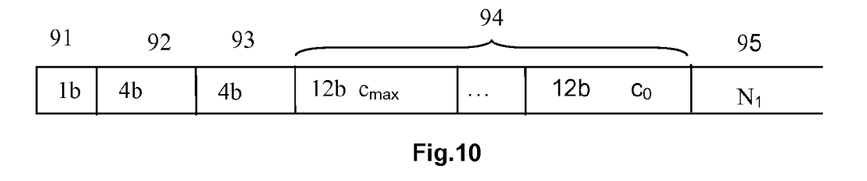
FIG. 10 the structure of an exemplary header of the bitstream.

Information about the structure of the stream is encoded in the header. As shown in FIG. 10, a single bit 91 may be encoded in the header that indicates whether there is any K sequence in the stream (e.g. initial bit 91 set to "1" means there is a K sequence). In one embodiment, if there is a K sequence, the following code word 92 (e.g. 4 bits) indicate the position of the last K sequence in the stream. This information is relevant for decoding, as described below. The code word 92 may be a sequence number indicating the boundary between the first part H1 and the second part H2 (so that in the example of FIG. 4, the code word 92 may have the value "4" for indicating $c_2$ as being the $4^{th}$ encoded boundary position when starting from the end, see below, or the value "5" for indicating $c_2$ as being the $5^{th}$ decoded boundary position when starting from the end, or the value "2" for indicating $c_2$, or it may be any value in the position range of the last K sequence $K_1$, e.g. 50, or similar). Thus, this code word 92 indicates also the last portion of the first part H1 of the bitstream, which ends with the last K sequence.

In one embodiment, the following second code word 93 indicates the number of encoded boundary positions. Note that the first and second code word 92,93 may be differently positioned in the bitstream (e.g. swapped), subject to a convention. Then, there follows a portion 94 with values representing the boundary positions $c_{max}, \ldots, c_0$ (e.g. 12 bit each, depending on possible stream length), and then the actual bitstream 95. In one embodiment, it is implicit that the first part H1 comprises only one N type portion and one K type portion. In this case, the code word 92 indicating the last portion of the first part H1 of the bitstream is not necessary.

Thus, the information in the header information reveals that the next subsequence (in reverse order) $N_3$ is still in the second part H2, and thus must be of the N type, since the second part H2 has alternating J type and N type portions and ends with a J type portion. It is determined that in this example the $N_3$ subsequence is very short, namely only one symbol, which in this embodiment is a default length for N subsequences. Thus, since the previous boundary position was $c_6=100$, the next boundary is $c_5=99$, i.e. the $N_3$ subsequence is [99,100]. Then, it is determined that the next portion (in reverse order) $J_2$ is in the second part H2, and thus must be of the J type. Its lower boundary is $c_4=72$. Then, it is determined that the next portion (in reverse order) $N_2$ is in the second part H2, and thus must be of the N type. Its lower boundary is $c_3=70$. Then, it is determined that the next portion (in reverse order) $J_1$ is in the second part H2, and thus must be of the J type. Its lower boundary is $c_2=50$. Here, it may be determined that $c_2$ as being the $4^{th}$ encoded boundary position value is the boundary between the first part H1 and the second part H2. Then, it is determined that the next portion (in reverse order) $K_1$ has a lower boundary of $c_1=30$, and therefore is the final portion of the first part H1 according to the first-part indicator 92. Thus, it must be of the K type.

That is, in this exemplary embodiment, the preliminary encoding of boundary positions is [100,99,72,70,50,30], and the second part H2 would begin at the $5^{th}$ decoded boundary position, i.e. at $c_2=50$. To obtain the final encoding of the boundary positions that provides additional bit savings, the preliminary encoding of the boundary positions is further refined as follows.

The lengths of at least the portions of the N type are compared with a default length value, e.g. one. It is determined that a portion of the N type has a length equal to the default length, and responsive to this determining, the encoding of the lower boundary of the N type portion is skipped. Thus, the encoding of one boundary value can be saved. To indicate N type portions that have a different length other than the default length, the boundary positions of an adjacent (e.g. the next) J type portion are swapped in the header. That is, while the boundary positions usually are encoded in monotonic order (decreasing $c_{max}, \ldots, c_0$ or increasing $c_0, \ldots, c_{max}$), see FIG. 10, and thus their values are increasing or decreasing in the monotonic order, the two boundary positions of a J type portion are swapped if the adjacent N portion has the default length.

That is, in this exemplary embodiment, the encoding of boundary positions would be [100,70,72,50,30]. The second part H2 would begin at the $4^{th}$ encoded boundary position $c_2=50$ (or at the $5^{th}$ decoded boundary position $c_2=50$ respectively, see below).

Since swapped boundary positions can be detected according to their values during decoding, there are no bits used for indicating boundary positions of N type sequences in the second part H2 of the bitstream. In one embodiment for data structures other than common 3D mesh models, a similar encoding method can also be used in the first part H1 of the bitstream.

In the above exemplary embodiment, the decoding of the boundary positions would be as follows (cf. FIG. 10): first, it is decoded from the first bit 91 of the stream that at least one K sequence exists. Then, in one embodiment, an indicator 92 indicating the boundary position $c_2$ after the last K sequence is decoded, having e.g. the value four. Then, in one embodiment, a value 93 representing the number of encoded boundary positions is decoded to be five. Then, the next (number_of_boundary_positions)*12 bits are decoded as boundary position values, namely [100,70,72,50,30]. In one embodiment, according to the indicator 92, the boundary position values before the $4^{th}$ encoded boundary position value (being fifty) are in the second part H2. Thus, if values are not monotonic decreasing (in this example), a boundary value indicating a 1-bit N portion was omitted. Thus, the decoder detects that the third value (i.e. 72) is higher than the second value (i.e. 70), and consequently inserts an implicit boundary position at (previous_boundary_position−1), which is 100−1=99, and further swaps the swapped boundary positions back to their correct order. Therefore, the decoding can retrieve the decoded position sequence to begin with [100,99,72,70, . . . ]. Subsequent boundary positions are monotonic, in this example. Therefore, the decoded position sequence is [100,99,72,70,50,30].

The indication 92 that indicates the last K portion, and thus the first part H1 of the bitstream, can be used to determine the type of portions. I.e., in one embodiment, from the fact of the indication 92 being e.g. five the decoder determines that the $5^{th}$ value (i.e. fifty) is the boundary between first part H1 and second part H2 of the bitstream. Therefore, the decoder determines that the leading four values (100, 99, 72, 70) are boundary positions between J type and N type portions, the fifth boundary position (50) is between J type and K type portions, or between H1 and H2 respectively, and the remaining boundary positions (in this case only 30) are between K type and N type portions.

Figure 5:
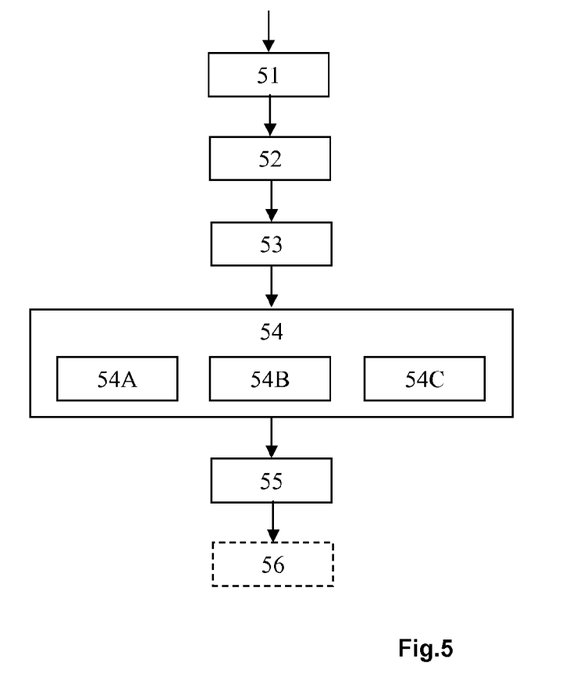
FIG. 5 a flow-chart of an encoding method.

FIG. 5 shows a flow-chart of an encoding method according to one embodiment of the invention. In this embodiment, the method for encoding a bitstream comprises the following steps: a first step comprises defining 51 at least a first and a second symbol group of binary symbols, wherein the first symbol group S1 is a subset of the second symbol group S2.

A second step comprises determining 52 within the bitstream two or more first portions J1, J2, zero or more second portions K1 and two or more third portions N1, N2, N3, wherein each first portion J has at least a first pre-defined number Th1 of consecutive symbols of the first symbol group S1, each second portion K has at least a second pre-defined number Th2 of consecutive symbols of the second symbol group, and wherein the remainder of the bitstream consists of third portions N1, N2, N3.

A third step comprises determining 53 in the bitstream at least a consecutive part H2 that comprises only first and third portions J1, J2, N2.

A fourth step comprises encoding 54 the bitstream, wherein said first portions are encoded 54A using a first code, said second portions are encoded 54B using a second code and said third portions are encoded 54C using a third code.

A fifth step comprises encoding 55 values $C_1$ indicating the boundary positions between the first, second and third portions in the bitstream, wherein in said consecutive part H2 that comprises only first and third portions, the encoding of a boundary position between a first portion J1, J2 and an adjacent third portion N2 (i.e. adjacent to the first portion J1, J2) is skipped if the length $L_{N2}$ of the third portion N2 is a pre-defined length, and the length $L_{N2}$ of the third portion N2 is implicitly encoded if it is different from the pre-defined length. The pre-defined length must be positive (i.e. non-zero), preferably it is one. However, it can be another value, e.g. two, depending on characteristic features of the data structure.

The pre-defined length may be implicitly pre-defined or explicitly pre-defined, e.g. as a parameter that is encoded as decoder control information.

In one embodiment, the pre-defined length is implicitly pre-defined to be one. This embodiment is particularly advantageous for coding bitstreams that result from the traversal of a tree structure of spatial tree based approaches for encoding 3D mesh models.

In one embodiment, the method for encoding a bitstream comprises steps of defining at least a first and a second symbol group S1, S2 of binary symbols, wherein the first symbol group S1 comprises less symbols than the second symbol group S2 and symbols of the first symbol group are also included in the second symbol group,
determining within the bitstream two or more first portions J1, J2, each having at least a first defined minimum number Th1 of consecutive symbols of the first symbol group S1, zero or more second portions K1, each having at least a second defined minimum number Th2 of consecutive symbols of the second symbol group S2, and two or more third portions N1, N2, N3 comprising remaining portions of the bitstream (wherein adjacent portions of equal type are accumulated, so that the stream has alternating adjacent portions of different type),
dividing the bitstream into at least a consecutive first part H1 and a consecutive second part H2, wherein the first part comprises at least one of said third portions N1 and said zero or more second portions K1, and the second part comprises at least one of said first portions N2 and said at least two second portions J1, J2, encoding the bitstream, wherein said one or more first portions J1, J2 are encoded using a first encoder Enc1, said one or more second portions K1 are encoded using a second encoder Enc2 and said one or more third portions N1, N2, N3 are encoded using a third encoder Enc3, and
encoding the lengths of the first, second and third portions in the bitstream, wherein at least in the second part H2 said encoding of the length $L_{N2}$, $L_{N3}$ of the first portions N2, N3 is skipped if the length is one.

Further advantageous embodiments of the encoding method are described below.

In one embodiment, the first symbol group (S1) comprises binary symbols that have one bit set to 1 and remaining bits set to 0, and the second symbol group (S2) comprises binary symbols that have one or two bits set to 1 and the remaining bits are 0.

In one embodiment, the bitstream represents a traversed octree representation of spatial data structure, in particular of a 3D mesh model.

In one embodiment, the encoding step 54 comprises a first encoding step 54A using the first code based on a first symbol set S1, a second encoding step 54B using the second code based on a second symbol set S2 and a third encoding step 54C using the third code based on a third symbol set S3. In one embodiment, at least a part of the first, second and third encoding 54A, 54B, 54C is performed simultaneously.

In one embodiment, decoder control information is encoded at the beginning of the bitstream, the decoder control information comprising said values $C_1$ indicating the boundary positions between the first, second and third portions of the bitstream.

In one embodiment, the boundary positions or lengths of the first, second and third portions in the bitstream are encoded as a sequence of values $c_{max}, \ldots, c_0$, wherein for the first part H1 and for first portions of the second part H2 of the bitstream the values representing boundary positions are encoded in a monotonic order if no boundary is skipped, and wherein said implicit encoding of a boundary position between a first portion J1, J2 and an adjacent third portion N2 comprises swapping the boundary order (i.e. lower and upper boundary) of said first portion J1. In one embodiment, said pre-defined length $L_{N2}$ of the third portion N2 of the bitstream is one.

Figure 6:
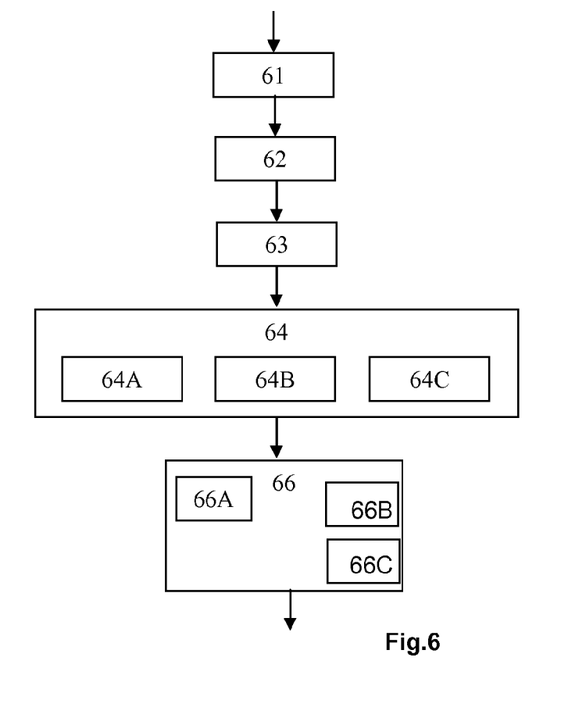
FIG. 6 a flow-chart of a decoding method.

FIG. 6 shows a flow-chart of a decoding method, according to one embodiment of the invention. The method for decoding a bitstream comprises the following steps. A first step comprises decoding 61 from the beginning of the bitstream control information $C_1$.

A second step comprises determining 62, according to said control information, within the bitstream at least two or more first portions J1, J2, each having consecutive symbols of a first symbol group S1, zero or more second portions K1, each having consecutive symbols of a second symbol group S2, and two or more third portions N1, N2, N3 having symbols of a third symbol group S3, wherein at least one of said third portions N1 and said zero or more second portions K1 are in a consecutive first part H1 of the bitstream, and at least one of said first portions N2 and said at least two second portions J1, J2 are in a consecutive second part H2 of the bitstream.

A third step comprises decoding 64 said consecutive symbols, and has at least the following three sub-steps.

A first sub-step comprises decoding 64A said consecutive symbols of the at least two or more first portions J1, J2 to symbols of a fixed length using a first symbol decoder (based on a first symbol group S1).

A second sub-step comprises decoding 64B said consecutive symbols of the zero or more second portions K1 to symbols of said fixed length using a first symbol decoder (based on a second symbol group S2), if at least one second portion K1 was determined. The second symbol group S2 comprises said symbols of the first symbol group S1 and additional symbols.

A third sub-step comprises decoding 64C the symbols of said two or more third portions N1, N2, N3 to symbols of said fixed length using a third symbol decoder (based on a third symbol group S3), wherein the third symbol group S3 comprises only symbols that are not comprised in said second symbol group S2.

Finally, a fourth step 66 comprises re-ordering and providing the decoded symbols of said first, second and third portions of the bitstream in a sequential order according to said control information.

Further advantageous embodiments of the decoding method are described below.

In one embodiment, the first symbol group comprises binary symbols that have one bit set to 1 and remaining bits are 0, and the second symbol group comprises binary symbols that have one or two bits set to 1 and the remaining bits are 0.

In one embodiment, the bitstream represents a traversed octree representation of a 3D mesh model.

In one embodiment, the step of decoding 61 control information $C_1$ from the beginning of the bitstream comprises decoding a sequence of values $c_{max}, \ldots, c_0$ indicating boundary positions of the first, second and third portions in the bitstream, wherein the values representing boundary positions for the first part H1 of the bitstream have a monotonic order, and wherein the values representing boundary positions for first portions J1, J2 of the second part H2 of the bitstream have a monotonic order.

In one embodiment, the decoding method further comprises steps of detecting 66B at least one pair $c_3$, $c_4$ of values representing boundary positions in the second part H2 of the bitstream having swapped monotonic order, and inserting 66C at a boundary position according to one of said values one of said first portions N2, N3 having a length according to the difference between said at least one pair $c_3$, $c_4$ of values.

In one embodiment, said decoding 64A of the at least two or more first portions J1, J2, said decoding 64B of the zero or more second portions K1 if at least one second portion K1 was determined and said decoding 64C of said two or more third portions N1, N2, N3 is performed at least partially simultaneously (at least partial time overlap).

In one embodiment, the step of providing 66 the decoded symbols of the first, second and third portions of the bitstream comprises reordering 66A said first, second and third portions.

In one embodiment, the control information $C_1$ comprises at least lengths of the first, second and third portions. The lengths may be expressed in the form of boundary positions.

Figure 11:
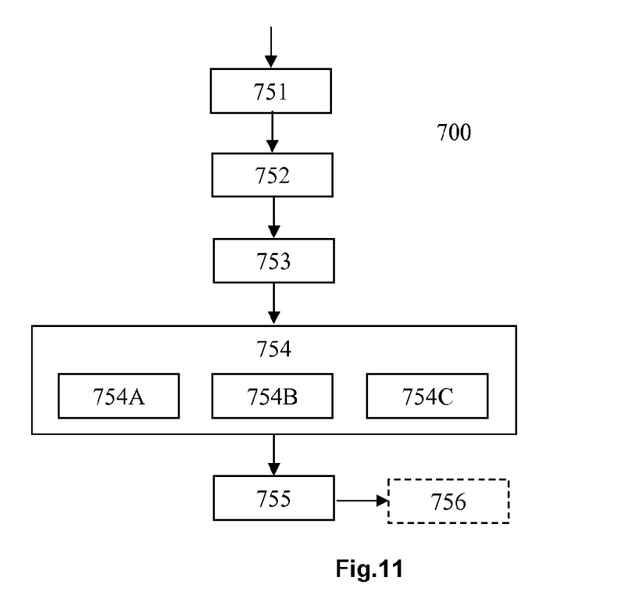
FIG. 11 a block diagram of an apparatus 700 for encoding a bitstream.

FIG. 11 shows a block diagram of an apparatus 700 for encoding a bitstream, according to one embodiment of the invention. In this embodiment, the apparatus for encoding a bitstream comprises the following modules. Each module may be implemented as a separate hardware block. A first module 751 is a symbol defining module for defining at least a first and a second symbol group of binary symbols, wherein the first symbol group S1 is a subset of the second symbol group S2.

A second module 752 is a determining module for determining within the bitstream two or more first portions J1, J2, zero or more second portions K1 and two or more third portions N1, N2, N3, wherein each first portion J has at least a first pre-defined number Th1 of consecutive symbols of the first symbol group S1, each second portion K has at least a second pre-defined number Th2 of consecutive symbols of the second symbol group, and wherein the remainder of the bitstream consists of third portions N1, N2, N3.

A third module 753 is a determining module for determining in the bitstream at least a consecutive part H2 that comprises only first and third portions J1, J2, N2.

A fourth module 754 is an encoding module for encoding the bitstream, wherein said first portions are encoded 754A using a first code, said second portions are encoded 754B using a second code and said third portions are encoded 754C using a third code.

A fifth module 755 is an encoding module for encoding values $C_1$ that indicate the boundary positions between the first, second and third portions in the bitstream, wherein in said consecutive part H2 that comprises only first and third portions, the encoding of a boundary position between a first portion J1, J2 and an adjacent third portion N2 (i.e. adjacent to the first portion J1, J2) is skipped if the length $L_{N2}$ of the third portion N2 is a pre-defined length, and the length $L_{N2}$ of the third portion N2 is implicitly encoded if it is different from the pre-defined length. The pre-defined length must be positive (i.e. non-zero), preferably it is one. However, it can be another value, e.g. two, depending on characteristic features of the data structure. The pre-defined length may be implicitly pre-defined or explicitly pre-defined, e.g. as a parameter that is encoded as decoder control information.

Figure 12:
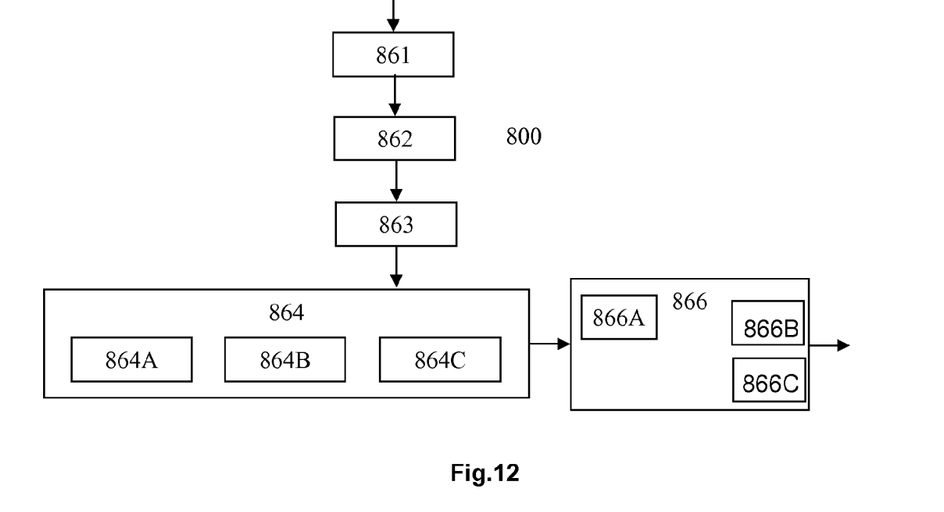
FIG. 12 a block diagram of an apparatus 700 for decoding a bitstream.

FIG. 12 shows a block diagram of an apparatus 800 for decoding a bitstream, according to one embodiment of the invention. In this embodiment, the apparatus for decoding a bitstream comprises the following modules. Each module may be implemented as a separate hardware block. A first module 861 is a decoding module for decoding 61 from the beginning of the bitstream control information $C_1$.

A second module 862 is a determining module for determining 62, according to said control information, within the bitstream at least two or more first portions J1, J2, each having consecutive symbols of a first symbol group S1, zero or more second portions K1, each having consecutive symbols of a second symbol group S2, and two or more third portions N1, N2, N3 having symbols of a third symbol group S3, wherein at least one of said third portions N1 and said zero or more second portions K1 are in a consecutive first part H1 of the bitstream, and at least one of said first portions N2 and said at least two second portions J1, J2 are in a consecutive second part H2 of the bitstream.

A third module 864 is a decoding module for decoding said consecutive symbols, and has at least the following three sub-modules.

A first sub-module 864A is a first decoding module for decoding said consecutive symbols of the at least two or more first portions J1, J2 to symbols of a fixed length using a first symbol decoder (based on a first symbol group S1).

A second sub-module 864B is a second decoding module for decoding said consecutive symbols of the zero or more second portions K1 to symbols of said fixed length using a first symbol decoder (based on a second symbol group S2), if at least one second portion K1 was determined. The second symbol group S2 comprises said symbols of the first symbol group S1 and additional symbols.

A third sub-module 864C is a third decoding module for decoding the symbols of said two or more third portions N1, N2, N3 to symbols of said fixed length using a third symbol decoder (based on a third symbol group S3), wherein the third symbol group S3 comprises only symbols that are not comprised in said second symbol group S2.

A fourth module 866 is a reconstruction and output module for re-ordering and providing the decoded symbols of said first, second and third portions of the bitstream in a sequential order according to said control information. I.e. this module reconstructs the various portions of the bitstream into the decoded bitstream.

In one embodiment of the apparatus for decoding, wherein the decoding module 861 for decoding control information $C_1$ from the beginning of the bitstream performs decoding a sequence of values ($c_{max}$, . . . , $c_0$) indicating boundary positions of the first, second and third portions in the bitstream, wherein the values representing boundary positions for the first part H1 of the bitstream have a monotonic order, and wherein the values representing boundary positions for first portions J1, J2 of the second part H2 of the bitstream have a monotonic order, and wherein the decoding module 861 further comprises a detection module 866B for detecting at least one pair ($c_3$, $c_4$, see above and FIG. 4) of values representing boundary positions in the second part H2 of the bitstream having swapped monotonic order, and an inserting module 866C for inserting at a boundary position according to one of said values one of said first portions N2, N3 having a length according to the difference between said at least one pair ($c_3$, $c_4$) of values.

FIG. 8 shows the principle of octree-based 3D geometry coding, compared to quadtree-based 2D geometry coding, as already described above.

Figure 9:
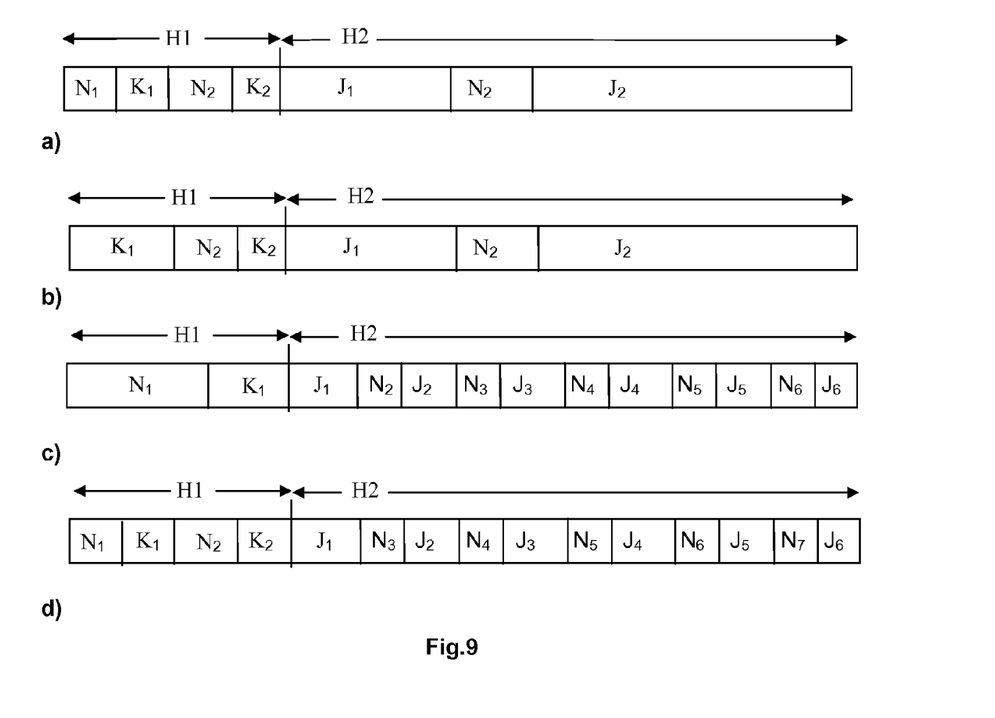
FIG. 9 various exemplary bitstream structures.

FIG. 9 shows various exemplary bitstream structures. In a first structure shown in FIG. 9 *a*), the first part H1 of the bitstream comprises two K type portions and consequently also two N type portions (since the initial portion is usually N type, corresponding to the root of the octree structure). The second part H2 of the bitstream comprises two J type portions, and consequently one N type portion (i.e. the number of N type portions is the number of J type portions minus one).

In a second structure shown in FIG. 9 *b*), the first part H1 of the bitstream comprises two K type portions and only one N type portion (corresponding to a rare case of a parent cell having only Th2 non-empty child cells, so that the initial portion is K type). Also this case can be handled according to the principles of the invention. The last K type portion is the $K_2$ portion in this case, and according to the number of boundary positions the decoder can determine that the initial sequence must be K type. The second part H2 of the bitstream comprises two J type portions, and consequently one N type portion.

In a third structure shown in FIG. 9 *c*), the first part H1 of the bitstream comprises one K type portion and consequently also one N type portion. If the first part comprises only a single portion, which can be encoded/decoded according to the number of boundary positions in the first part, an additional indication may be required for indicating whether it is K type or N type, as mentioned above. The second part H2 of the bitstream comprises six J type portions, and consequently five N type portions (number of J type portions minus one).

In a fourth structure shown in FIG. 9 *d*), the first part H1 of the bitstream comprises two K type portions and consequently also two N type portions. The second part H2 of the bitstream comprises six J type portions, and consequently five N type portions (number of J type portions minus one).

FIG. 10 shows the structure of an exemplary header of the bitstream, and was already described above. For simplicity, the above-described embodiments restrict the number of K type subsequences to one. A 4-bit binary 92 at the beginning of the bitstream can be used to indicate the last subsequence of K type. This will be the first decoded K type subsequence, since the decoding starts at the end of the bitstream. E.g. the binary 92 is to "0000" when there is no subsequence qualified to be K, and the first part H1 comprises only an N type portion.

The present invention provides a method for efficiently compressing data that can be divided into a number of sections having significantly different statistical distributions. By applying the most appropriate statistical model to each part, it achieves greater compression. In particular, the invented method works very well on the octree compression for the positions of 3D vertices.

One advantage of the coding is that it adjusts itself to the features of different sections of data. The best probability model is automatically selected and applied to the arithmetic coding (or other entropy compression) of different sections, making an optimal compression. Another advantage of the invention is that the section bounds are specified by a reduced number of indices, compares with known methods. Specifically, in one embodiment for the octree compression, the symbols of the octree are divided into few sections which are coded by a 255-symbol probability model, a 36-symbol probability model or an 8-symbol probability model. These models are optimized for octree data of a large amount of 3D models, particularly complex or medium-complex 3D models. Yet another advantage of the invention is that three (or more) entropy codecs with the above initial probability models may run independently to compress the corresponding data.

The following remarks relate to specific embodiments.

In one embodiment (as in FIG. 4), the order of bound indicators is inverted before encoding, i.e., from $c_y$ to $c_1$. Observe that most $N_i$s (i>2) have only one element, to code two bound indicators for such one-symbol subsequences are too wasteful. Thus, only the upper bound is coded. E.g., if $N_3$ has only one symbol, then $c_5$ does not need to be coded if $c_6$ has been coded. When $N_3$ has multiple symbols, both $c_5$ and $c_6$ are coded. But $c_5$ is coded ahead of $c_6$ unlike the ordinary order. Then the decoder will be instructed to consider $N_3$ as a multiple-symbol subsequence. Thus, not all bound indicators are necessary. Suppose there are x boundary position indicators that have to be coded, x is coded as a 4-bit binary and the necessary bound indicators are coded as 12-bit binaries. For the example in FIG. 4, the values written into the bitstream are [5: 100, 70, 72, 50, 30]. Code the symbols in $N_i$s, $K_i$s, $J_i$s with three (or two) arithmetic encoders respectively.

The initial probability model of N and K is determined according to probability models of Tab. 1, while the initial probability of J is set as uniform distribution. The above models are optimized based on the statistics of octree symbols of various geometry data. The results of the three arithmetic encoders are combined and written into bitstream. The first two arithmetic encoders may have one more terminal symbol in addition to the ordinary symbols, which separates the substreams coded by different encoders.

In one embodiment, decoding has the following steps to decompress the bitstream: Reading in one bit to decide where the subsequence $K_1$, if existed, is located; reading in a 4-bit binary and decode it as a decimal value x. x is the number of bound indicators in the bitstream; reading in x 12-bit binaries and decode them as decimal values, $c_x$ to $c_1$; constructing the clip structure of symbol sequences according to the decoded bound indicators. Taking FIG. 4 as an example, x=5 and the decoded $c_i$s are [100, 70, 72, 50, 30]. Since the ending subsequence is always J, $c_x$ must be its lower bound location. So we have $J_3$=[100, ∞], "∞" means the upper bound depends on the number of decoded symbols.

Further steps of the decoding are that, after obtaining the last J subsequence, the previous are constructed one by one. If $c_i > c_{i-1}$ (the ordinary monotonic case), the previous subsequence has only one symbol, and a new value [$c_i$−1] is inserted as the upper bound of the subsequence before previous. In the example, [100] and [70, 99] are obtained.

If $c_i < c_{i-1}$ (the non-monotonic case), the previous subsequence is [$c_{i-1}$, $c_i$]. In other words, generally in all embodiments the boundary positions are swapped if the adjacent N subsequence does not have its default length. The boundary of the current subsequence may be updated. In the example, the obtained bound [70, 90] is updated to [72, 90], and a new subsequence bound [70, 72] is available.

Decompress the symbols with three or two arithmetic decoders which have predefined initial probability models. When a terminal symbol for one substream occurs, a new decoder begins to work. Then three or two series of decoded symbols to put into the appropriate position in the subsequences are obtained. It should be noted that although shown in connection with octree compression, other types of coding may be constructed other than octree compression, as would be apparent to those of ordinary skill in the art, all of which are contemplated within the spirit and scope of the invention. Further, it should be noted that although shown in connection with particular first and second symbol sets S1, S2, other types of symbol sets, and/or additional symbol set hierarchies (e.g. a symbol set S3 with 1, 2 or 3 bits set to 1), may be constructed, as would be apparent to those of ordinary skill in the art, all of which are contemplated within the spirit and scope of the invention. This is especially true if the data to be coded have a significant different statistical distribution in different sections.

While there has been shown, described, and pointed out fundamental novel features of the present invention as applied to preferred embodiments thereof, it will be understood that various omissions and substitutions and changes in the apparatus and method described, in the form and details of the devices disclosed, and in their operation, may be made by those skilled in the art without departing from the spirit of the present invention. Although the present invention has been disclosed with regard to 3D mesh models, one skilled in the art would recognize that the method and devices described herein may be applied to any data compression method or apparatus that uses quadtree, octree or comparable similar approaches, in particular for (but not limited to) geometry coding. Examples are spatial points (i.e. points with spatial coordinates), e.g. points on a map, points on any 3-dimensional structure, or similar. Since the spatial points are represented by their 2D or 3D coordinates, and the tree structure encodes relationship between the points, and it is actually the tree that is encoded, the invention can be used for encoding any tree-like structure that represents relationships between leaf elements that are characterized by n-dimensional coordinates (including n=1, 2, 3, 4, etc.), and particularly model-adaptive entropy coding. It is expressly intended that all combinations of those elements that perform substantially the same function in substantially the same way to achieve the same results are within the scope of the invention. Substitutions of elements from one described embodiment to another are also fully intended and contemplated.

It will be understood that the present invention has been described purely by way of example, and modifications of detail can be made without departing from the scope of the invention.

Each feature disclosed in the description and (where appropriate) the claims and drawings may be provided independently or in any appropriate combination. Features may, where appropriate be implemented in hardware, software, or a combination of the two. Reference numerals appearing in the claims are by way of illustration only and shall have no limiting effect on the scope of the claims.

CITED REFERENCES

[OG00] O. Devillers, P. Gandoin. Geometric compression for interactive transmission, in: IEEE Visualization, 2000, pp. 319-326

[PK05] J. L. Peng, C.-C. Jay Kuo, Geometry-guided progressive lossless 3D mesh coding with octree (OT) decomposition, ACM SIGGRAPH (ACM Transactions on Graphics 24(3)), 609-616, 2005

The invention claimed is:

1. A method for encoding a bitstream, the bitstream representing a traversed octree representation of a 3D mesh model, the method comprising:
    defining at least a first and a second symbol group of binary symbols, wherein the first symbol group is a subset of the second symbol group;
    determining within the bitstream two or more first portions, zero or more second portions and two or more third portions, wherein each first portion has at least a first pre-defined number of consecutive symbols of the first symbol group, each second portion has at least a second pre-defined number of consecutive symbols of the second symbol group, and wherein remaining parts of the bitstream are third portions;
    determining in the bitstream a part that comprises only first and third portions;
    encoding the bitstream, wherein said first portions are encoded using a first code, said second portions are encoded using a second code and said third portions are encoded using a third code; and
    encoding values indicating the boundary positions between the first, second and third portions in the bitstream, wherein in said part that comprises only first and third portions the encoding of a boundary position between a first portion and an adjacent third portion is skipped and implicitly encoded if the third portion has a pre-defined length.

2. Method according to claim 1, wherein the first symbol group comprises binary symbols that have one bit set to 1 and remaining bits set to 0, and the second symbol group comprises binary symbols that have one or two bits set to 1 and the remaining bits are 0.

3. Method according to claim 1, wherein the encoding comprises a first encoding using the first code based on a first symbol set, a second encoding using the second code based on a second symbol set and a third encoding using the third code based on a third symbol set, and wherein at least a part of the first, second and third encoding is performed simultaneously.

4. Method according to claim 1, wherein decoder control information is encoded at the beginning of the bitstream, the decoder control information comprising said values indicating the boundary positions between the first, second and third portions of the bitstream.

5. Method according to claim 1, wherein the boundary positions or lengths of the first, second and third portions in the bitstream are encoded as a sequence of values, wherein for the first part and for first portions of the second part of the bitstream the values representing boundary positions are encoded in a monotonic order if no boundary is skipped, and wherein said implicit encoding of a boundary position between a first portion and an adjacent third portion comprises swapping the boundary order of said first portion.

6. Method according to claim 1, wherein said pre-defined length of the third portion of the bitstream is one.

7. Method for decoding a bitstream, the bitstream representing a traversed octree representation of a 3D mesh model, comprising:
    decoding from the beginning of the bitstream control information that comprises lengths of the first, second and third portions;
    determining, according to said control information, within the bitstream at least two or more first portions, each having consecutive symbols of a first symbol group, zero or more second portions, each having consecutive symbols of a second symbol group, and two or more third portions having symbols of a third symbol group, wherein at least one of said third portions and said zero or more second portions are in a consecutive first part of the bitstream, and at least one of said first portions and said at least two second portions are in a consecutive second part of the bitstream;

decoding said consecutive symbols of the at least two or more first portions to symbols of a fixed length using a first symbol decoder based on a first symbol group;

decoding said consecutive symbols of the zero or more second portions to symbols of said fixed length using a first symbol decoder based on a second symbol group, wherein the second symbol group comprises said symbols of the first symbol group and additional symbols if at least one second portion was determined;

decoding the symbols of said two or more third portions to symbols of said fixed length using a third symbol decoder based on a third symbol group, wherein the third symbol group comprises only symbols that are not comprised in said second symbol group; and providing the decoded symbols of said first, second and third portions of the bitstream in a sequential order according to said control information.

8. Method according to claim 7, wherein the first symbol group comprises binary symbols that have one bit set to 1 and remaining bits are 0, and the second symbol group comprises binary symbols that have one or two bits set to 1 and the remaining bits are 0.

9. Method according to claim 7, wherein the decoding control information from the beginning of the bitstream comprises decoding a sequence of values indicating boundary positions of the first, second and third portions in the bitstream, wherein the values representing boundary positions for the first part of the bitstream have a monotonic order, and wherein the values representing boundary positions for first portions of the second part of the bitstream have a monotonic order, further comprising:

detecting at least one pair of values representing boundary positions in the second part of the bitstream having swapped monotonic order; and inserting at a boundary position according to one of said values one of said first portions having a length according to the difference between said at least one pair of values.

10. Method according to claim 7, wherein said decoding of the at least two or more first portions, said decoding of the zero or more second portions if at least one second portion was determined and said decoding of said two or more third portions is performed at least partially simultaneously, and wherein the step of providing the decoded symbols of the first, second and third portions of the bitstream comprises reordering said first, second and third portions.

11. An apparatus for encoding a bitstream, comprising at least a memory and one or more processors, wherein the one or more processors are configured to:

define at least a first and a second symbol group of binary symbols, wherein the first symbol group is a subset of the second symbol group;

determine within the bitstream two or more first portions, zero or more second portions and two or more third portions, wherein each first portion has at least a first pre-defined number of consecutive symbols of the first symbol group, each second portion has at least a second pre-defined number of consecutive symbols of the second symbol group, and wherein remaining parts of the bitstream are third portions;

determine in the bitstream a part that comprises only first and third portions;

encode the bitstream, wherein said first portions are encoded in a first sub-encoder using a first code, said second portions are encoded in a second sub-encoder using a second code and said third portions are encoded in a third sub-encoder using a third code; and encode values indicating the boundary positions between the first, second and third portions in the bitstream, wherein in said part that comprises only first and third portions the encoding of a boundary position between a first portion and an adjacent third portion is skipped and implicitely encoded if the third portion has a pre-defined length.

12. An apparatus for decoding a bitstream, comprising at least a memory and one or more processors, wherein the one or more processors are configured to:

decode from the beginning of the bitstream control information;

determine, according to said control information, within the bitstream at least two or more first portions, each having consecutive symbols of a first symbol group, zero or more second portions, each having consecutive symbols of a second symbol group, and two or more third portions having symbols of a third symbol group, wherein at least one of said third portions and said zero or more second portions are in a consecutive first part of the bitstream, and at least one of said first portions and said at least two second portions are in a consecutive second part of the bitstream;

decode said consecutive symbols of the at least two or more first portions to symbols of a fixed length using a first symbol decoder, based on a first symbol group;

decode said consecutive symbols of the zero or more second portions to symbols of said fixed length using a first symbol decoder if at least one second portion was determined; and decode the symbols of said two or more third portions to symbols of said fixed length using a third symbol decoder based on a third symbol group, wherein the third symbol group comprises only symbols that are not comprised in said second symbol group; and provide the decoded symbols of said first, second and third portions of the bitstream in a sequential order according to said control information.

13. Apparatus according to claim 12, wherein the one or more processors are configured to decode a sequence of values indicating boundary positions of the first, second and third portions in the bitstream, wherein the values representing boundary positions for the first part of the bitstream have a monotonic order, and wherein the values representing boundary positions for first portions of the second part of the bitstream have a monotonic order, and the one or more processors are further configured to:

detect at least one pair of values representing boundary positions in the second part of the bitstream having swapped monotonic order; and insert at a boundary position according to one of said values one of said first portions having a length according to the difference between said at least one pair of values.

14. A non-transitory computer readable medium having executable instructions to cause a computer to perform a method according to claim 1.

15. A non-transitory computer readable medium having executable instructions to cause a computer to perform a method according to claim 7.

16. A non-transitory computer readable medium having stored thereon an encoded bitstream representing a 3D mesh model and being encoded using at least a first and a second symbol group of binary symbols, wherein the first symbol group is a subset of the second symbol group, the encoded bitstream comprising:

two or more first portions, zero or more second portions and two or more third portions, wherein each first portion has at least a first pre-defined number of consecutive symbols of the first symbol group, each second portion has at least a second pre-defined number of consecutive symbols of the second symbol group, and remaining parts of the bitstream are third portions, and wherein said first portions are encoded using a first code, said second portions are encoded using a different second code and said third portions are encoded using a third code different from the first and second codes;

at least one part that comprises only first and third portions; and values indicating boundary positions between the first, second and third portions in the bitstream, wherein in a part that comprises only first and third portions the encoding of a boundary position between a first portion and an adjacent third portion is skipped and implicitely encoded if the third portion has a pre-defined length.

* * * * *

UNITED STATES PATENT AND TRADEMARK OFFICE
CERTIFICATE OF CORRECTION

PATENT NO. : 9,532,056 B2  
APPLICATION NO. : 14/233519  
DATED : December 27, 2016  
INVENTOR(S) : Wen Fei Jiang, Kangying Cai and Zhibo Chen Page 1 of 1

It is certified that error appears in the above-identified patent and that said Letters Patent is hereby corrected as shown below:

In the Claims

At Column 19, Line 44, after "wherein" delete "the step of"

At Column 20, Line 6, replace "implicitely" with --implicitly--

At Column 21, Line 18, replace "implicitely" with --implicitly--

Signed and Sealed this  
Twenty-first Day of November, 2023

Katherine Kelly Vidal  
*Director of the United States Patent and Trademark Office*